US012660230B2

(12) United States Patent
Yang

(10) Patent No.: US 12,660,230 B2
(45) Date of Patent: Jun. 16, 2026

(54) HIGH ELECTRON MOBILITY TRANSISTOR AND METHOD FOR FABRICATING THE SAME

(71) Applicant: UNITED MICROELECTRONICS CORP., Hsin-Chu City (TW)

(72) Inventor: Po-Yu Yang, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 664 days.

(21) Appl. No.: 17/980,538

(22) Filed: Nov. 3, 2022

(65) Prior Publication Data

US 2024/0113215 A1    Apr. 4, 2024

(30) Foreign Application Priority Data

Sep. 30, 2022    (CN) .......................... 202211208853.5

(51) Int. Cl.
| | |
|---|---|
| *H10D 30/47* | (2025.01) |
| *H10D 30/01* | (2025.01) |
| *H10D 62/824* | (2025.01) |
| *H10D 62/85* | (2025.01) |
| *H10D 64/01* | (2025.01) |
| *H10D 64/27* | (2025.01) |
| *H10P 14/60* | (2026.01) |
| *H10P 50/00* | (2026.01) |
| *H10P 50/28* | (2026.01) |
| *H10W 74/10* | (2026.01) |

(52) U.S. Cl.
CPC ......... *H10D 30/475* (2025.01); *H10D 30/015* (2025.01); *H10D 62/824* (2025.01); *H10D 62/8503* (2025.01); *H10D 64/01* (2025.01); *H10D 64/411* (2025.01); *H10P 14/662* (2026.01); *H10P 50/283* (2026.01); *H10P 50/73* (2026.01); *H10W 74/137* (2026.01); *H10W 74/147* (2026.01)

(58) Field of Classification Search
None
See application file for complete search history.

(56) References Cited

U.S. PATENT DOCUMENTS

| | | | |
|---|---|---|---|
| 8,492,261 B2 | 7/2013 | Van Hove et al. | |
| 2013/0105812 A1* | 5/2013 | Ishigaki | H10D 62/8164 257/192 |
| 2016/0268162 A1* | 9/2016 | Akasaka | H01L 21/76802 |
| 2021/0083085 A1* | 3/2021 | Chang | H10D 30/015 |

* cited by examiner

*Primary Examiner* — Xiaoming Liu
(74) *Attorney, Agent, or Firm* — Winston Hsu

(57) ABSTRACT

A method for fabricating a high electron mobility transistor (HEMT) includes the steps of forming a channel layer on a substrate, forming a first barrier layer on the channel layer, forming a p-type semiconductor layer on the first barrier layer, forming a first patterned passivation layer on the p-type semiconductor layer, and then forming a gate electrode on the first patterned passivation layer. Preferably, the gate electrode includes a first portion adjacent to one side of the first patterned passivation layer and a second portion adjacent to another side of the first patterned passivation layer.

20 Claims, 6 Drawing Sheets

HIGH ELECTRON MOBILITY TRANSISTOR AND METHOD FOR FABRICATING THE SAME

BACKGROUND OF THE INVENTION

1. Field of the Invention

The invention relates to a high electron mobility transistor (HEMT) and method for fabricating the same.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a method for fabricating a high electron mobility transistor (HEMT) includes the steps of forming a channel layer on a substrate, forming a first barrier layer on the channel layer, forming a p-type semiconductor layer on the first barrier layer, forming a first patterned passivation layer on the p-type semiconductor layer, and then forming a gate electrode on the first patterned passivation layer. Preferably, the gate electrode includes a first portion adjacent to one side of the first patterned passivation layer and a second portion adjacent to another side of the first patterned passivation layer.

According to another aspect of the present invention, a high electron mobility transistor (HEMT) includes a channel layer on a substrate, a barrier layer on the channel layer, a p-type semiconductor layer on the barrier layer, a first patterned passivation layer on the p-type semiconductor layer, and a gate electrode on the first patterned passivation layer. Preferably, the gate electrode includes a first portion adjacent to one side of the first patterned passivation layer and a second portion adjacent to another side of the first patterned passivation layer.

These and other objectives of the present invention will no doubt become obvious to those of ordinary skill in the art after reading the following detailed description of the preferred embodiment that is illustrated in the various figures and drawings.

DETAILED DESCRIPTION

Referring to the FIGS. 1-8, FIGS. 1-8 illustrate a method for fabricating a HEMT according to an embodiment of the present invention. As shown in the FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a selective nucleation layer (not shown) and a channel layer 14 are formed on the substrate 12. According to an embodiment of the present invention, the nucleation layer preferably includes aluminum nitride (AlN) and the channel layer 14 is preferably made of III-V semiconductors such as gallium nitride (GaN), in which a thickness of the channel layer 14 could be between 0.5 microns to 10 microns. According to an embodiment of the present invention, the formation of the channel layer 14 on the substrate 12 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, an unintentionally doped (UID) buffer layer (not shown) could be formed on the surface of the channel layer 14. In this embodiment, the UID buffer layer is preferably made of III-V semiconductors such as gallium nitride (GaN) or more specifically unintentionally doped GaN. According to an embodiment of the present invention, the formation of the UID buffer layer on the channel layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 16 is formed on the surface of the UID buffer layer or channel layer 14. In this embodiment, the barrier layer 16 is preferably made of III-V semiconductor such as n-type or n-graded aluminum gallium nitride ($Al_xGa_{1-x}N$), in which $0<x<1$, the barrier layer 16 preferably includes an epitaxial layer formed through epitaxial growth process, and the barrier layer 16 could include dopants such as silicon or germanium. Similar to the channel layer 14, the formation of the barrier layer 16 on the channel layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Figure 1:
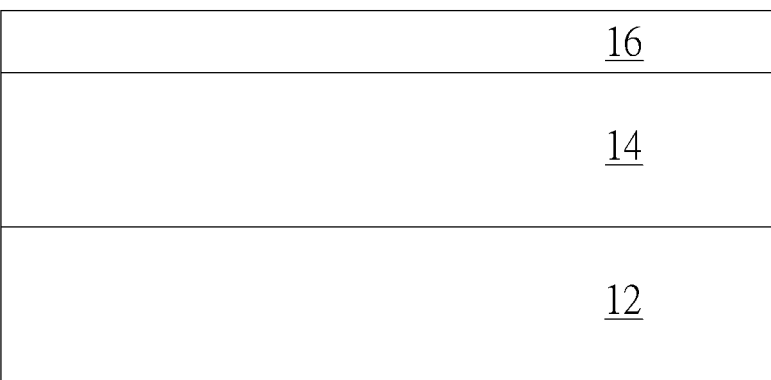
FIGS. 1-8 illustrate a method for fabricating a HEMT according to an embodiment of the present invention.
Figure 2:
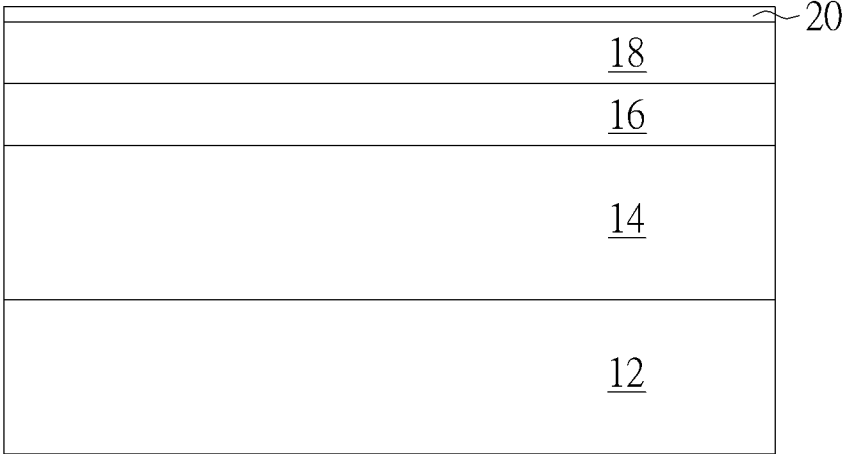

Next, as shown in FIG. 2, a p-type semiconductor layer 18 and an etching stop layer 20 are formed on the barrier layer 16. In this embodiment, the p-type semiconductor layer 18 is a III-V compound semiconductor layer preferably including p-type GaN (pGaN) and the formation of the p-type semiconductor layer 18 on the barrier layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof. The etching stop layer 20 preferably includes dielectric material such as silicon nitride (SiN) and the thickness of the etching stop layer 20 is approximately 10 nm, but not limited thereto.

Figure 3:
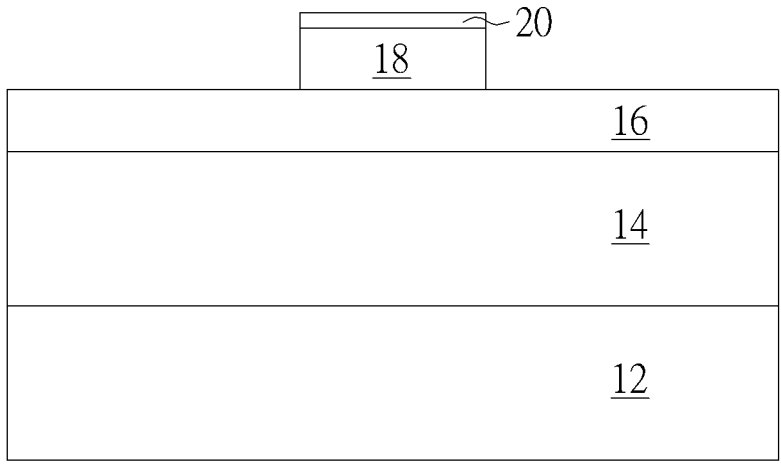

Next, as shown in FIG. 3, a photo-etching process is conducted to pattern the etching stop layer 20 and the p-type semiconductor layer 18. Specifically, it would be desirable to first form a patterned mask (not shown) such as patterned resist on the etching stop layer 20, and then an etching process is conducted to remove part of the etching stop layer 20 and part of the p-type semiconductor layer 18 to form a patterned etching stop layer 20 and patterned p-type semiconductor layer 18 and exposing the surface of the barrier layer 16 on two adjacent sides.

Figure 4:
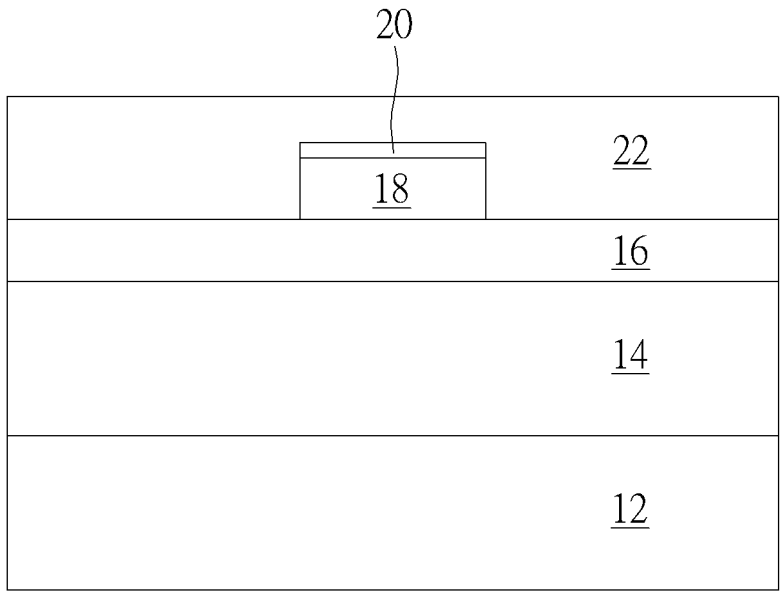

Next, as shown in FIG. 4, a passivation layer 22 is formed on the barrier layer 16 and the etching stop layer 20. In this embodiment, the passivation layer 22 is preferably made of dielectric material such as silicon oxide and the thickness of the passivation layer 22 is approximately 260 nm, but not limited thereto.

Figure 5:
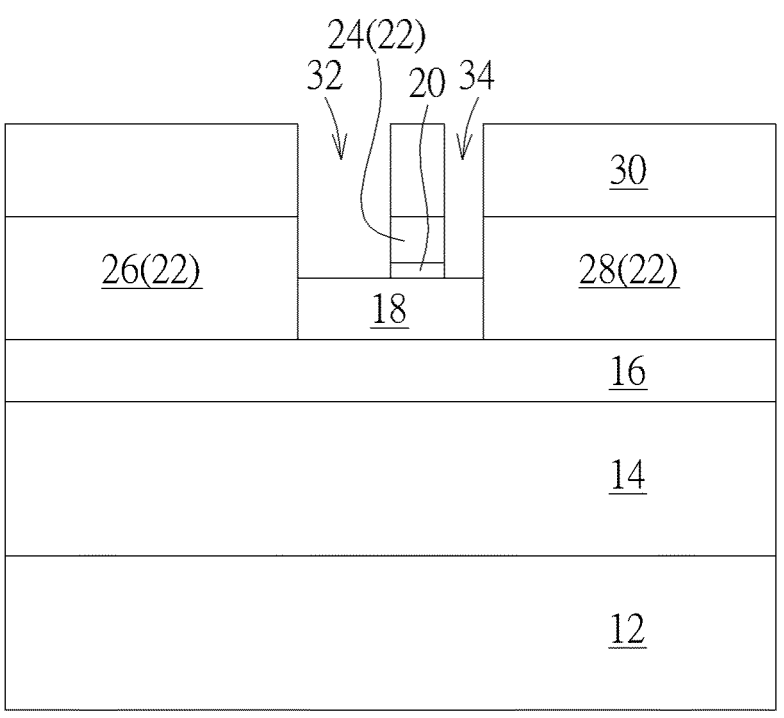

Next, as shown in FIG. 5, the passivation layer 22 is patterned to form a first patterned passivation layer 24, a second patterned passivation layer 26, and a third patterned passivation layer 28. Specifically, it would be desirable to first form a patterned mask 30 on the passivation layer 22 and then conduct an etching process by using the patterned mask 30 as mask to remove part of the passivation layer 22 and part of the etching stop layer 20 directly on top of the p-type semiconductor layer 18 for forming the first patterned passivation layer 24 directly on the p-type semiconductor layer 18, the second patterned passivation layer 26 on left side of the p-type semiconductor layer 18, and the third patterned passivation layer 28 on right side of the p-type semiconductor layer 18. Preferably, a first opening 32 is formed at the same time between the first patterned passivation layer 24 and the second patterned passivation layer 26 and a second opening 34 is formed between the first patterned passivation layer 24 and the third patterned passivation layer 28, in which the first opening 32 exposes the p-type semiconductor layer 18 between the first patterned passivation layer 24 and the second patterned passivation layer 26 and the second opening 34 exposes the p-type semiconductor layer 18 between the first patterned passivation layer 24 and the third patterned passivation layer 28.

Figure 6:
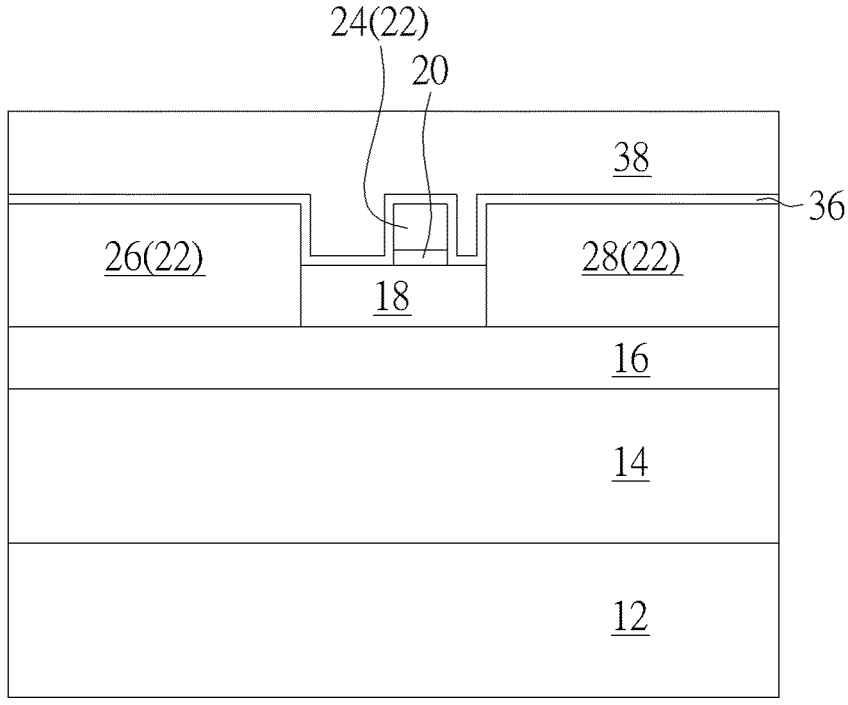

Next, as shown in FIG. 6, after removing the patterned mask 30, another barrier layer 36 is formed on the first patterned passivation layer 24, the second patterned passivation layer 26, and the third patterned passivation layer 28 without filling the first opening 32 and the second opening 34 completely, and then a gate electrode layer 38 is formed on the barrier layer 36 to fill the first opening 32 and the second opening 34 completely. In this embodiment, the barrier layer 36 preferably includes Ti, TiN, Ta, TaN, or combination thereof, the thickness of the barrier layer 36 is between 2-40 nm, and the gate electrode layer 38 preferably includes Ti, Mo, Pt, Cr, W, Ni, Al, AlCu alloy, AlSiCu alloy, Cu, or combination thereof.

Figure 7:
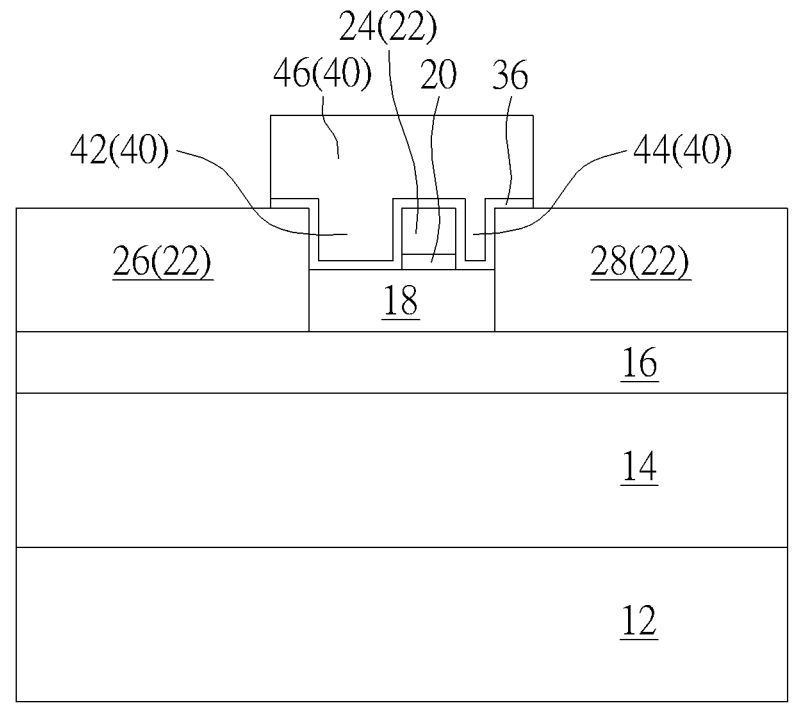

Next, as shown in FIG. 7, the gate electrode layer 38 and the barrier layer 36 are patterned to form a gate electrode 40. Specifically, the patterning process could be accomplished by first forming a patterned mask (not shown) such as patterned resist on the gate electrode layer 38 and then using the patterned mask as mask to remove part of the gate electrode layer 38 and part of the barrier layer 36 adjacent to two sides of the p-type semiconductor layer 18 for forming a gate electrode 40 on the first patterned passivation layer 24, the second patterned passivation layer 26, and the third patterned passivation layer 28. Viewing from a more detailed perspective, the gate electrode 40 formed at this stage includes a first portion 42 adjacent to one side of the first patterned passivation layer 24 or between the first patterned passivation layer 24 and the second patterned passivation layer 26, a second portion adjacent to another side of the first patterned passivation layer 24 or between the first patterned passivation layer 24 and the third patterned passivation layer 28, and a third portion 46 disposed on the first portion 42, the first patterned passivation layer 24, and the second portion 44 while extending on top of the passivation layer 22 on two adjacent sides. It should be noted that even though the gate electrode 40 is nominally divided into three portions in this embodiment, these three portions 42, 44, 46 are formed monolithically thereby all belong to the same gate electrode 40.

Figure 8:
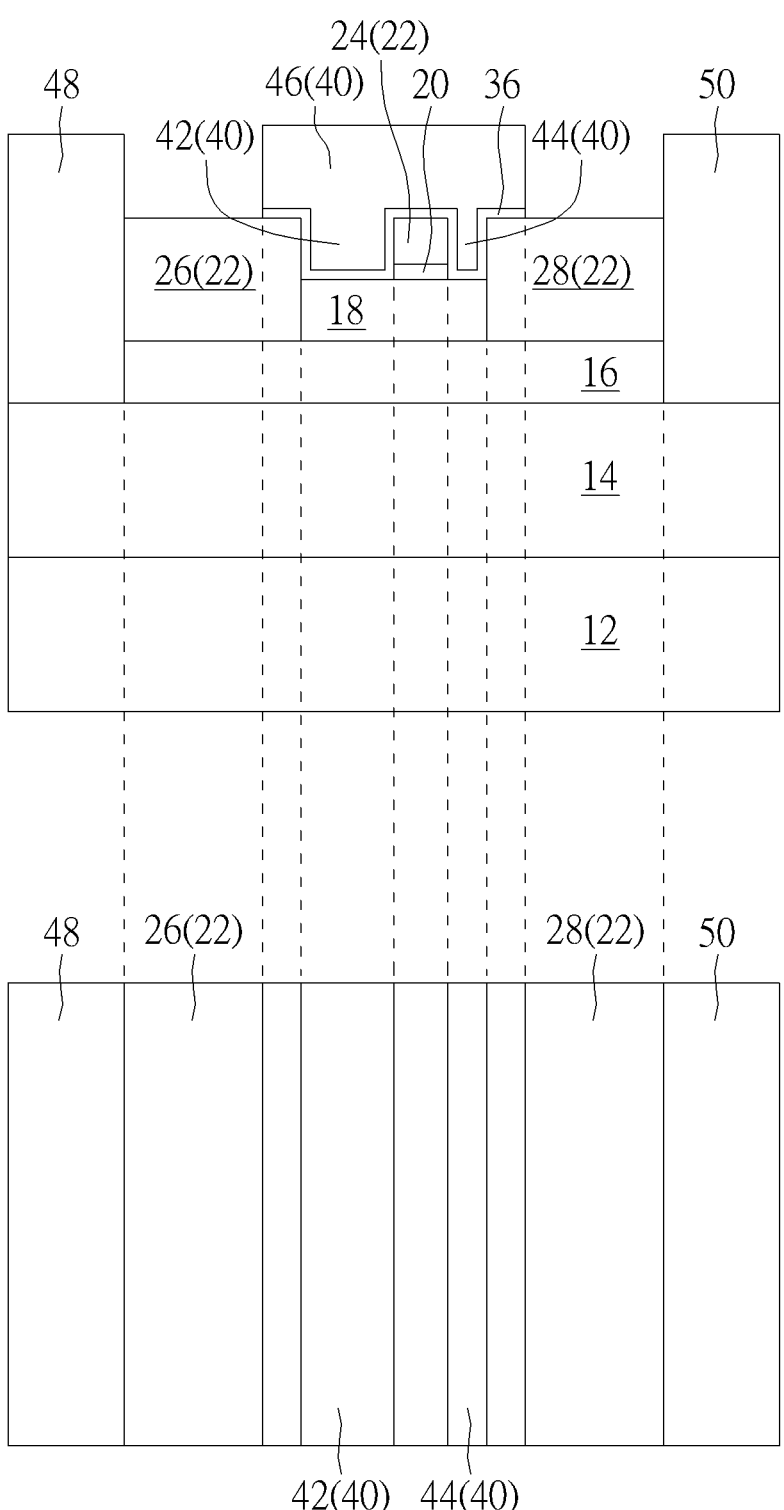

Referring to FIG. 8, the top portion of FIG. 8 illustrates a cross-section view for fabricating a HEMT following FIG. 7 and the top portion is a top view perspective corresponding to the top portion. As shown in FIG. 8, it would be desirable to conduct a photo-etching process to remove part of the passivation layer 22 and even part of the barrier layer 16 adjacent to two sides of the gate electrode 40 for forming two recesses, and then form a source electrode 48 and a drain electrode 50 in the recesses adjacent to two sides of the gate electrode 40.

In this embodiment, the gate electrode 40, the source electrode 48, and the drain electrode 50 are preferably made of metal, in which the gate electrode 40 is preferably made of Schottky metal while the source electrode 48 and the drain electrode 50 are preferably made of ohmic contact metals. According to an embodiment of the present invention, each of the gate electrode 40, source electrode 48, and drain electrode 50 could include gold (Au), Silver (Ag), platinum (Pt), titanium (Ti), aluminum (Al), tungsten (W), palladium (Pd), or combination thereof. Preferably, it would be desirable to conduct an electroplating process, sputtering process, resistance heating evaporation process, electron beam evaporation process, physical vapor deposition (PVD) process, chemical vapor deposition (CVD) process, or combination thereof to form electrode materials in the aforementioned openings, and then pattern the electrode materials through one or more etching processes to form the gate electrode 40, source electrode 48, and the drain electrode 50. This completes the fabrication of a HEMT according to an embodiment of the present invention.

Referring again to FIG. 8, FIG. 8 further illustrates a structural view of a HEMT according to an embodiment of the present invention. As shown in FIG. 8, the HEMT preferably includes a channel layer 14 disposed on the substrate 12, a barrier layer 16 disposed on the channel layer 14, a p-type semiconductor layer 18 disposed on the barrier layer 16, a first patterned passivation layer 24 disposed directly on top of the p-type semiconductor layer 18, a source electrode 48 disposed on one side of the p-type semiconductor layer 18, a drain electrode 50 disposed on another side of the p-type semiconductor layer 18, a second patterned passivation layer 26 disposed between the p-type semiconductor layer 18 and the soured electrode 48, a third patterned passivation layer 28 disposed between the p-type semiconductor layer 18 and the drain electrode 50, and a gate electrode 40 disposed on the p-type semiconductor layer 18 while overlapping all the first patterned passivation layer 24, part of the second patterned passivation layer 26, and part of the third patterned passivation layer 28.

Preferably, the gate electrode 40 further includes a first portion 42 disposed on one side of the first patterned passivation layer 24 such as between the first patterned passivation layer 24 and the second patterned passivation layer 26, a second portion 44 disposed on another side of the first patterned passivation layer 24 such as between the first patterned passivation layer 24 and the third patterned passivation layer 28, and a third portion 46 disposed on the first portion 42, the first patterned passivation layer 24, and the second portion 44 while extending to the top surface of the passivation layer 22 on two adjacent sides. As disclosed previously, even though the gate electrode 40 is nominally divided into three portions 42, 44, 46, these three portions 42, 44, 46 are formed monolithically thereby all belong to the same gate electrode 40.

It should be noted that the first portion 42 and the second portion 44 of the gate electrode 40 preferably have different widths, in which the width of the first portion 42 closer to the source electrode 48 end is preferably greater than the width of the second portion 44 closer to the drain electrode 50 end. For instance, the width of the first portion 42 could be 1.5 times, two times, three times, or even four times or more than the width of the second portion 44. The width of the first patterned passivation layer 24 between the first portion 42 and the second portion 44 is preferably equal to or slightly less than the width of the first portion 42 but greater than the width of the second portion 44.

Moreover, as shown in the top view perspective on the bottom portion of FIG. 8, the distance measuring from the left sidewall of the first portion 42 to the right sidewall of the second portion 44 is defined as a gate contact length, and since the left sidewall of the first portion 42 and the right sidewall of the second portion 44 are aligned with left and sidewalls of the p-type semiconductor layer 18 underneath as shown in the cross-section perspective on top portion of FIG. 8, the overall gate contact length if viewed from the top view perspective would be substantially equal to the length of the p-type semiconductor layer 18 or the distance measuring from the left sidewall of the p-type semiconductor layer 18 to the right sidewall of the p-type semiconductor layer 18.

Figure 9:
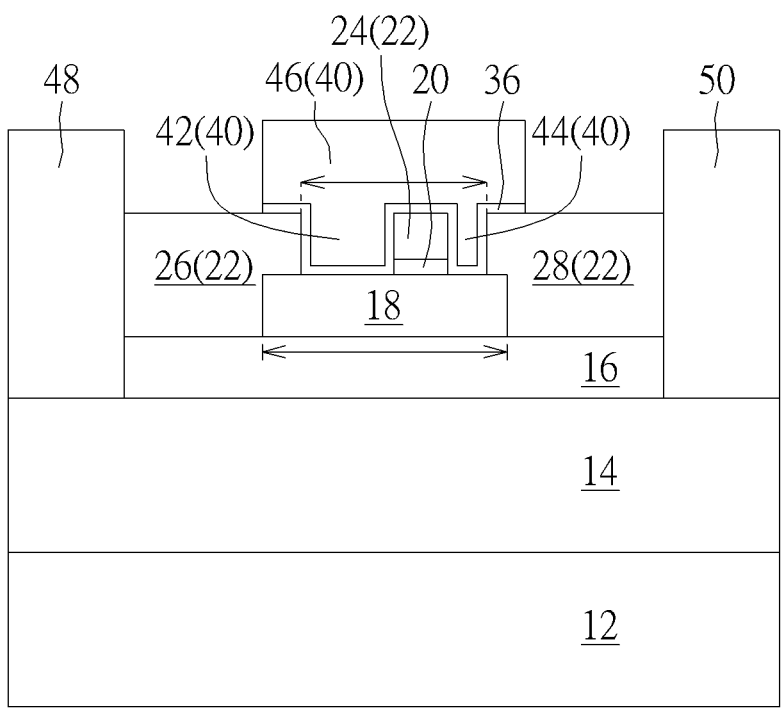
FIG. 9 illustrates a structural view of a HEMT according to an embodiment of the present invention.

Referring to FIG. 9, FIG. 9 further illustrates a structural view of a HEMT according to an embodiment of the present invention. As shown in FIG. 9, in contrast to the gate contact length being equal to the overall length of the p-type semiconductor layer 18 as disclosed in the aforementioned embodiment, it would also be desirable to adjust the position of the openings during patterning of the passivation layer 22 so that the overall length of the p-type semiconductor layer (shown by longer arrow) is greater than the gate contact length (shown by shorter arrow).

Viewing from the cross-section perspective shown in FIG. 9, the distance measuring from the left sidewall of the first portion 42 to the right wall of the second portion 44 is slightly less than the distance measuring from the left sidewall of the p-type semiconductor layer 18 to the right sidewall of the p-type semiconductor layer 18 and the sidewalls of the third portion 46 on top could be aligned with or not aligned with the left and right sidewalls of the p-type semiconductor layer 18. If the left and right sidewalls of the third portion 46 were not aligned with left and right sidewalls of the p-type semiconductor layer 18, the overall width of the third portion 46 could be greater than or slightly less than the width of the p-type semiconductor layer 18 but still greater than the distance measuring from the left sidewall of the first portion 42 to the right sidewall of the second portion 44, which are all within the scope of the present invention.

Overall, the present invention discloses a novel gate electrode structure for improving overall reliability of a HEMT device. As disclosed in the aforementioned embodiments, the gate electrode formed on the p-type semiconductor layer could be divided into three portions including a first portion 42 and a second portion 44 disposed directly on the p-type semiconductor layer without exceeding or surpassing beyond left and right sidewalls of the p-type semiconductor layer and a third portion 46 overlapping the entire p-type semiconductor while extending to overlap part of the passivation layer 22 adjacent to two sides of the p-type semiconductor layer. Preferably, the first portion 42 and the second portion 44 have different or asymmetrical widths and/or lengths and the width or length of the first portion 42 closer to the source electrode is greater than the width or length of the second portion 44 closer to the drain electrode.

According to a preferred embodiment of the present invention, by using the aforementioned approach to form a gate electrode having portions with different or asymmetrical widths on the p-type semiconductor layer while having the width or length of the gate electrode closer to the source electrode end to be greater than the width or length of the gate electrode closer to the drain electrode end, it would be desirable to increase electron concentration, scattering probability, and transmission time on the drain electrode end and at the same time lowering hot carrier generation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a high electron mobility transistor (HEMT), comprising:

forming a channel layer on a substrate;

forming a first barrier layer on the channel layer;

forming a p-type semiconductor layer on the first barrier layer;

forming a first patterned passivation layer on the p-type semiconductor layer;

forming a gate electrode on the first patterned passivation layer, wherein the gate electrode comprises:

a first portion adjacent to one side of the first patterned passivation layer; and a second portion adjacent to another side of the first patterned passivation layer, wherein the first portion and the second portion are directly on the same p-type semiconductor layer and a length from a sidewall of the first portion to a sidewall of the second portion is equal to a length from a sidewall of the p-type semiconductor layer to another sidewall of the p-type semiconductor layer.

2. The method of claim 1, further comprising:

forming an etching stop layer on the p-type semiconductor layer;

patterning the etching stop layer and the p-type semiconductor layer;

forming a passivation layer on the first barrier layer and the p-type semiconductor layer;

patterning the passivation layer to form the first patterned passivation layer, a second patterned passivation layer, and a third patterned passivation layer; and forming the gate electrode on the first patterned passivation layer, the second patterned passivation, and the third patterned passivation layer.

3. The method of claim 2, further comprising:

patterning the passivation layer to form a first opening between the first patterned passivation layer and the second patterned passivation layer and a second opening between the first patterned passivation layer and the third patterned passivation layer;

forming a second barrier layer on the first patterned passivation layer, the second patterned passivation layer, and the third patterned passivation layer;

forming a gate electrode layer on the second barrier layer and into the first opening and the second opening; and patterning the gate electrode layer and the barrier layer to form the gate electrode.

4. The method of claim 3, wherein the gate electrode comprises:

the first portion between the first patterned passivation layer and the second patterned passivation layer;

the second portion between the first patterned passivation layer and the third patterned passivation layer; and a third portion on the first portion, the first patterned passivation layer, and the second portion.

5. The method of claim 1, further comprising forming a source electrode adjacent to the first portion of the gate electrode and a drain electrode adjacent to the second portion of the gate electrode.

6. The method of claim 5, wherein a width of the first portion is greater than a width of the second portion.

7. The method of claim 1, wherein the first portion and the second portion are asymmetric.

8. The method of claim 1, wherein the channel layer comprises gallium nitride (GaN).

9. The method of claim 1, wherein the first barrier layer comprise $Al_xGa_{1-x}N$.

10. The method of claim 1, wherein the p-type semiconductor layer comprises p-type gallium nitride (pGaN).

11. A high electron mobility transistor (HEMT), comprising:

a channel layer on a substrate;

a barrier layer on the channel layer;

a p-type semiconductor layer on the barrier layer;

a first patterned passivation layer on the p-type semiconductor layer;

a gate electrode on the first patterned passivation layer, wherein the gate electrode comprises:

a first portion adjacent to one side of the first patterned passivation layer; and a second portion adjacent to another side of the first patterned passivation layer, wherein the first portion and the second portion are directly on the same p-type semiconductor layer and a length from a sidewall of the first portion to a sidewall of the second portion is equal to a length from a sidewall of the p-type semiconductor layer to another sidewall of the p-type semiconductor layer.

12. The HEMT of claim 11, further comprising:

a source electrode adjacent to one side of the p-type semiconductor layer;

a drain electrode adjacent to another side of the p-type semiconductor layer;

a second patterned passivation layer between the p-type semiconductor layer and the source electrode; and a third patterned passivation layer between the p-type semiconductor layer and the drain electrode.

13. The HEMT of claim 12, wherein the gate electrode further comprises a third portion on the first portion, the first patterned passivation layer, and the second portion.

14. The HEMT of claim 13, wherein the third portion is on the second patterned passivation layer and the third patterned passivation layer.

15. The HEMT of claim 12, wherein the second patterned passivation layer is between the first portion and the source electrode.

16. The HEMT of claim 15, wherein a width of the first portion is greater than a width of the second portion.

17. The HEMT of claim 11, wherein the first portion and the second portion are asymmetric.

18. The HEMT of claim 11, wherein the channel layer comprises gallium nitride (GaN).

19. The HEMT of claim 11, wherein the barrier layer comprise $Al_xGa_{1-x}N$.

20. The HEMT of claim 11, wherein the p-type semiconductor layer comprises p-type gallium nitride (pGaN).

* * * * *